United States Patent
Yang et al.

(10) Patent No.: US 7,888,198 B1
(45) Date of Patent: Feb. 15, 2011

(54) METHOD OF FABRICATING A MOS TRANSISTOR WITH DOUBLE SIDEWALL SPACERS IN A PERIPHERAL REGION AND SINGLE SIDEWALL SPACERS IN A CELL REGION

(75) Inventors: Won-Suk Yang, Seoul (KR); Ki-Nam Kim, Kyunggi-do (KR); Chang-Hyun Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 09/313,659

(22) Filed: May 18, 1999

(30) Foreign Application Priority Data

May 20, 1998 (KR) ............................... 1998-18167

(51) Int. Cl.
*H01L 21/00* (2006.01)
(52) U.S. Cl. .................. 438/231; 438/305; 257/336; 257/E21.626
(58) Field of Classification Search ............... 438/303, 438/305, 307, 231; 257/378, 379
See application file for complete search history.

(56) References Cited

U.S. PATENT DOCUMENTS

| | | | |
|---|---|---|---|
| 5,023,190 A | 6/1991 | Lee et al. | |
| 5,254,866 A | 10/1993 | Ogoh | |
| 5,298,401 A * | 3/1994 | Binder | 437/57 |
| 5,372,960 A * | 12/1994 | Davies et al. | 438/291 |
| 5,500,379 A | 3/1996 | Odake et al. | |
| 5,534,449 A | 7/1996 | Dennison et al. | 437/34 |
| 5,552,331 A * | 9/1996 | Hsu et al. | 437/40 |
| 5,567,964 A * | 10/1996 | Kashihara et al. | 257/310 |
| 5,583,067 A | 12/1996 | Sanchez | |
| 5,654,213 A * | 8/1997 | Choi et al. | 438/227 |
| 5,719,425 A | 2/1998 | Akram et al. | |
| 5,747,373 A | 5/1998 | Yu | |

(Continued)

FOREIGN PATENT DOCUMENTS

GB 2257563 * 1/1993

(Continued)

OTHER PUBLICATIONS

DeWitt G. Ong, Mordem MOS Technology : Process, Devices and Design, pp. 145-147, 1986.*

(Continued)

*Primary Examiner*—Phat X Cao
*Assistant Examiner*—Abul Kalam
(74) *Attorney, Agent, or Firm*—Volentine & Whitt, PLLC

(57) ABSTRACT

An improved source/drain junction configuration in a metal-oxide semiconductor transistor is provided, as well as a novel method for fabricating this junction. This configuration employs gate double sidewall spacers in the peripheral region and gate single sidewall spacers in the cell array region. The double sidewall spacers are advantageously formed to suppress the short channel effect, to prevent current leakage, and to reduce sheet resistance. The insulating layer used to form the second spacers in the peripheral region remains in the cell array region and serves as an etching stopper during the etching step of interlayer insulating layer for contact opening formation and also serves as a barrier layer during the step of silicidation formation. As a result the fabrication process of the resulting device is simplified.

20 Claims, 16 Drawing Sheets

U.S. PATENT DOCUMENTS

| | | | |
|---|---|---|---|
| 5,747,855 A | | 5/1998 | Dennison et al. |
| 5,811,329 A | | 9/1998 | Ahmad et al. ............... 438/233 |
| 5,827,747 A | | 10/1998 | Wang et al. |
| 5,849,615 A | * | 12/1998 | Ahmad et al. ............... 438/231 |
| 5,903,029 A | * | 5/1999 | Hayashida et al. .......... 257/344 |
| 5,952,693 A | * | 9/1999 | Wu et al. .................... 257/344 |
| 5,998,274 A | * | 12/1999 | Akram et al. ............... 438/306 |
| 6,066,894 A | * | 5/2000 | Yokozeki .................... 257/754 |
| 6,121,091 A | * | 9/2000 | Wang ......................... 438/275 |
| 6,281,062 B1 | * | 8/2001 | Sanchez ..................... 438/217 |
| 6,326,250 B1 | * | 12/2001 | Ahmad et al. ............... 438/197 |
| 6,346,439 B1 | * | 2/2002 | Ahmad et al. ............... 438/231 |

FOREIGN PATENT DOCUMENTS

| | | |
|---|---|---|
| JP | 63-252461 | 10/1988 |
| JP | 01-143357 | 6/1989 |
| JP | 03-257962 | 11/1991 |
| JP | 06-216151 | 8/1994 |
| JP | 08-037162 | 2/1996 |
| JP | 08-250728 | 9/1996 |
| JP | 09-312380 | 12/1997 |
| JP | 10-041482 | 2/1998 |
| WO | WO 98/44552 | 10/1998 |

OTHER PUBLICATIONS

Wolf et al., "Silicon Processing for the VLSI Era, vol. 1: Process Technology" Lattice Press, pp. 309 and 325. Sep. 1986.

* cited by examiner

NMOS

NMOS

PMOS

METHOD OF FABRICATING A MOS TRANSISTOR WITH DOUBLE SIDEWALL SPACERS IN A PERIPHERAL REGION AND SINGLE SIDEWALL SPACERS IN A CELL REGION

This application relies for priority upon Korean Patent Application No. 98-18167, filed on May 20, 1998, the contents of which are herein incorporated by reference in their entirety.

FIELD OF THE INVENTION

The present invention relates to a semiconductor device and a method of manufacturing such a device. More particularly, the present invention relates to a method for fabricating a MOS transistor having gate double sidewall spacers.

BACKGROUND OF THE INVENTION

A DRAM cell device is generally divided into a cell array region and a peripheral logic region. The cell array region includes a plurality of memory cells in a matrix-type format, and the peripheral region includes a circuit to operate the memory cells.

Transistors are formed in both the cell array region and in the peripheral region, respectively, to have different optimal characteristics, since the transistors must function differently according to their roles in the device. For example, the transistor in the cell array region may have a single source/drain region made of a low concentration impurity diffusion region, while a transistor in the peripheral region may have a source/drain of a LDD (lightly doped drain) structure. In addition, the transistor in the cell array region may have gate single spacers and the transistor in the peripheral region may have gate double spacers.

FIGS. 1A to 1C are cross-sectional views of MOS transistors formed by a conventional method. FIG. 1A schematically shows a cell array NMOS transistor in a cell array region. Referring to FIG. 1A, the cell array NMOS transistor includes a gate electrode 12 formed over a semiconductor substrate 10, gate spacers 14, with a thickness of about 700 Å to 800 Å, aligned on either lateral side of the gate electrode 12, and a low concentration n-type impurity diffusion region 16 with a predetermined depth in the semiconductor substrate 10, outwardly disposed from the gate spacers 14.

FIGS. 1B and 1C schematically show a peripheral NMOS transistor and a peripheral PMOS transistor, respectively, formed on the peripheral region. The peripheral NMOS transistor includes a gate electrode 22, gate spacers 24, with a thickness of about 700 Å to 800 Å, aligned on either lateral side of the gate electrode 22, a low concentration n-type impurity diffusion region 25 with a predetermined depth, in the semiconductor substrate 10, downwardly disposed from lateral edge of the gate spacers 24, and a high concentration n-type impurity region 26 with a predetermined depth in the semiconductor substrate 10, disposed outwardly from a lateral edge of the gate spacers 24. In other words, the peripheral NMOS transistor has a so-called LDD (lightly doped drain) structure.

Referring to FIG. 1C, the peripheral PMOS transistor includes a gate electrode 32, gate spacers 34, with a thickness of about 700 Å to 800 Å, aligned on lateral side of the gate electrode 32, a low concentration n-type or p-type impurity diffusion region 35, with a predetermined depth in the semiconductor substrate 10 downwardly disposed from a lateral edge of the gate spacers 34, and a high concentration p-type impurity region 36, with a predetermined depth in the semiconductor substrate 10 disposed outwardly from lateral edge of the gate spacers 34. In other words, the peripheral PMOS transistor also has a so-called LDD (lightly doped drain) structure.

The n-type impurity preferably comprises P (phosphorous), As (arsenic), or the like. As is well known, an arsenic impurity has a greater molecular weight than a phosphorous impurity and can therefore cause substrate damage and current leakage. On the other hand, phosphorous has a greater diffusion rate than arsenic and can therefore cause a short channel effect in the transistor. As a result, phosphorous is generally used for the formation of transistors in the cell array region, for clear on/off operation and improved refresh time. In the peripheral region, phosphorous is generally used for long channel transistors, and arsenic is generally used for short channel transistors, despite the danger of leakage loss.

As described above, phosphorous ions have a greater diffusion rate, which increases the short channel effect. To address problems with phosphorous ions and to obtain a maximum effective channel length, cell array NMOS transistors in the cell array region are formed according to the following process sequence. After a gate spacer 24 is formed on the lateral sidewall of the gate 22, an impurity ions implanting process is performed using the gate 22 and gate spacer 24 as a mask, to form an n-type impurity diffusion region 26 and thereby obtain a maximum effective channel length. A heat treatment is required, however, to drive out n-type impurities into the semiconductor substrate both outside of the gate electrode. It is very difficult, however, to diffuse out n-type impurities to a desired depth within the semiconductor substrate.

Also, the impurity in the peripheral region simultaneously diffuses out and the effective channel length of the transistor is likewise reduced, thereby causing the device fail. In particular, a p-type impurity diffusion region of the peripheral PMOS transistor in the peripheral region is formed by implanting boron (B), which has a greater diffusion rate. As a result, the peripheral PMOS transistor is greatly affected by the reduction of the effective channel length.

To address the effect of the reduced effective channel length in the peripheral region, an n-type low-concentration impurity diffusion region can be replaced by a different n-type low concentration impurity diffusion region as shown in FIG. 1C. By doing this, the problem of reduction of the effective channel length encountered in the p-type diffusion region can be prevented. As can be seen in FIG. 1C, a high concentration p-type impurity diffusion region is overlapped with low concentration n-type impurity diffusion region. However, the formation of such diffusion region configuration requires very careful controlling of both the thickness of the gate spacer 34 and of the annealing temperature. Also, the diffusion of a high concentration p-type impurity makes the impurity in the LDD region maintain a high concentration, thus making it difficult to prevent hot carrier effect.

SUMMARY OF THE INVENTION

The present invention was made in view of the above problem, and it is therefore an object of the invention to provide a MOS transistor with an improved source/drain structural configuration, as well as a method for fabricating a MOS transistor that can prevent a short channel effect and a hot carrier effect and can avoid a reduction in the effective channel length.

The present invention provides for a double LDD structure comprising a first lightly-doped region of first type, a second lightly-doped region of second type, and a third heavily-doped region of second type. Such a double LDD structure in accordance with the present invention is formed by first implanting a low concentration of an impurity of a first type into a semiconductor substrate using a gate as a mask. Second implantation of a low concentration of an impurity of a second type is implemented after the formation of first gate spacers on lateral sides of the gate. After the second implantation, second gate spacers are formed adjacent to the first gate spacers, and a third implantation of a high concentration of an impurity of a second type is implemented using the double gate spacers as a mask. Implanted impurities are then diffused out by a heat treatment and so complete the LDD structure.

In accordance with one aspect of the present invention, the method for fabricating a MOS transistor includes forming a device isolation region on a semiconductor substrate to define a cell array region and a peripheral circuit region, forming a first gate in the cell array region, a second gate in the peripheral circuit region, and a third gate in the peripheral circuit region, implanting first impurity ions of a low concentration into a first portion of the semiconductor substrate adjacent to the second and third gates, using the second and third gates as a mask, to form a first impurity diffusion region of a first conductivity type, forming first gate spacers on lateral sides of the first, second, and third gates, implanting second impurity ions of a low concentration into a second portion of the semiconductor substrate adjacent to the first gate and first gate spacers, using the first gate and first gate spacers as a mask, to form a second impurity diffusion region of a first conductivity type, implanting third impurity ions of a low concentration into a third portion of the semiconductor substrate adjacent to the third gate and first gate spacers, using the third gate and first gate spacers as a mask, to form a third impurity diffusion region of a second conductivity type, forming an insulating layer over the semiconductor substrate, first through third gates, and first gate spacers, etching the insulating layer in the peripheral region to form second gate spacers adjacent to the first spacers adjacent to the second and third gates, implanting fourth impurity ions of a high concentration into a fourth portion of the semiconductor substrate adjacent to the second gate and second spacers, using the second gate and first and second spacers as a mask, to form a fourth impurity diffusion region of a first conductivity type, and implanting fifth impurity ions of a high concentration into a fifth portion of the semiconductor substrate adjacent to the third gate and second spacers, using the third gate and first and second spacers as a mask, to form a fifth impurity diffusion region of a second conductivity type.

In accordance with another aspect of the present invention, the method for fabricating a MOS transistor includes forming a gate electrode over a semiconductor substrate, implanting first impurity ions at a low concentration of a first conductivity type, using the gate electrode as a mask, to form a first impurity diffusion layer, forming first spacers on lateral sides of the gate, implanting second impurity ions at a low concentration of a second conductivity type, using the gate and first spacers as a mask, to form a second impurity diffusion layer, forming a second spacers adjacent to the first spacers, implanting third impurity ions of high concentration of a second conductivity type, using the gate and the first and second spacers as a mask, to form a third impurity diffusion layer, and annealing and diffusing the impurity diffusion layers to overlap the first diffusion layer with the second diffusion layer.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

In keeping with the objects of the invention, a method for fabricating a MOSFET device is covered in detail with reference to accompanying drawings. The present invention is particularly related to a MOS transistor with a double LDD structure, especially the forming of a PMOS transistor with a double LDD structure in a peripheral region of a memory device, while forming an NMOS transistor with a single LDD structure in a cell array region. The double LDD structure of PMOS in the peripheral region acts to suppress both a short channel effect and a hot carrier effect.

FIGS. 2A to 11A illustrate, at selected stages of fabrication, the cross-sections of a cell array NMOS transistor in the cell array region in accordance with a preferred embodiment of the present invention; FIGS. 2B to 11B illustrate, at selected stages of fabrication, the cross-sections of a peripheral NMOS transistor in the peripheral region in accordance with a preferred embodiment of the present invention; and FIGS. 2C to 11C illustrate, at selected stages of fabrication, the cross-sections of a peripheral PMOS transistor in the peripheral region in accordance with a preferred embodiment of the present invention.

Figure 1A:
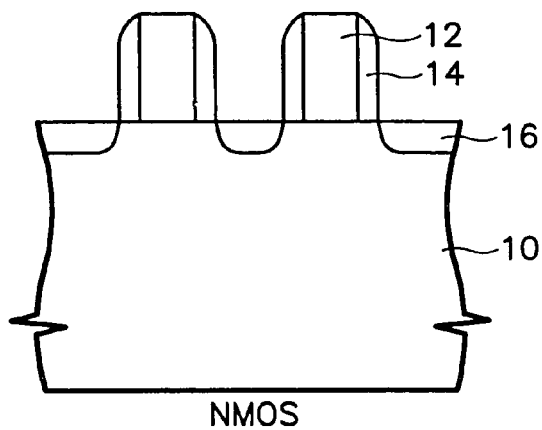
FIGS. 1A to 1C illustrate cross-sectional views of completed MOS transistor configurations manufactured in accordance with a conventional method.
Figure 1B:
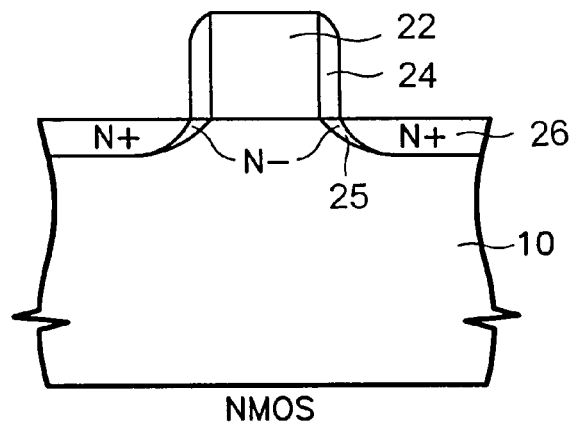
Figure 1C:
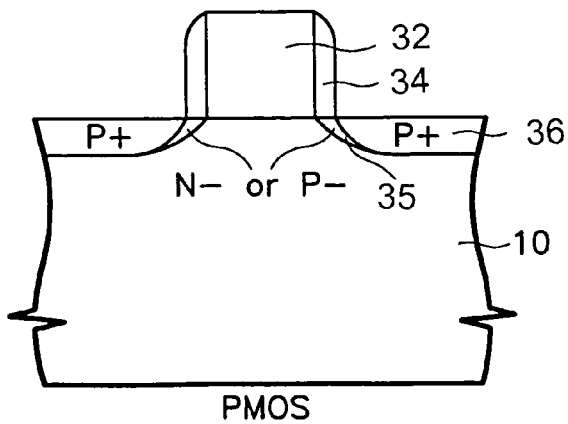
Figure 2A:
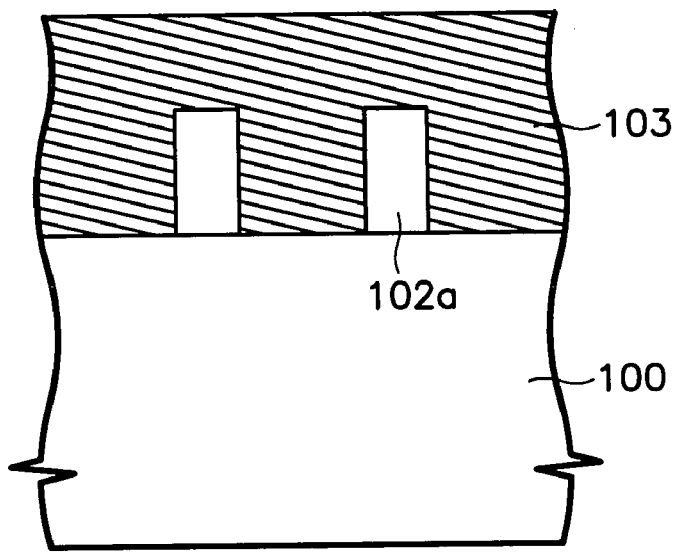
FIGS. 2A to 2C illustrate cross-sectional views of a semiconductor substrate having a gate electrode wherein an implantation of a low concentration of n-type impurities is carried out only in the peripheral region in accordance with a preferred embodiment of the present invention.
Figure 2B:
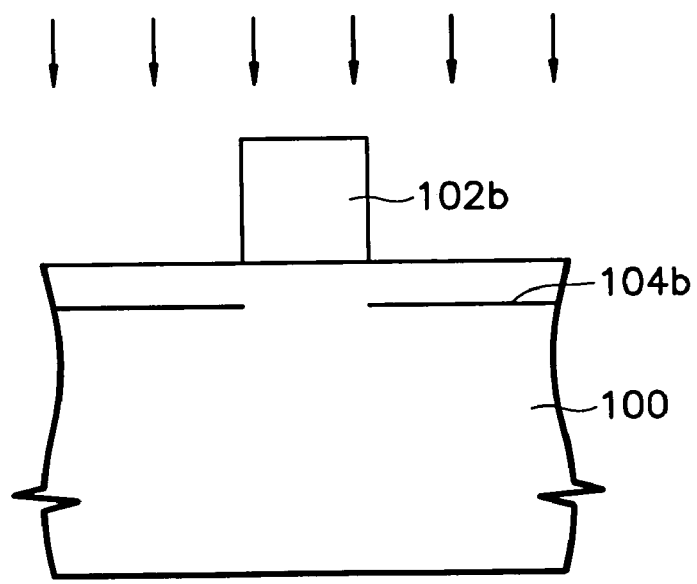
Figure 2C:
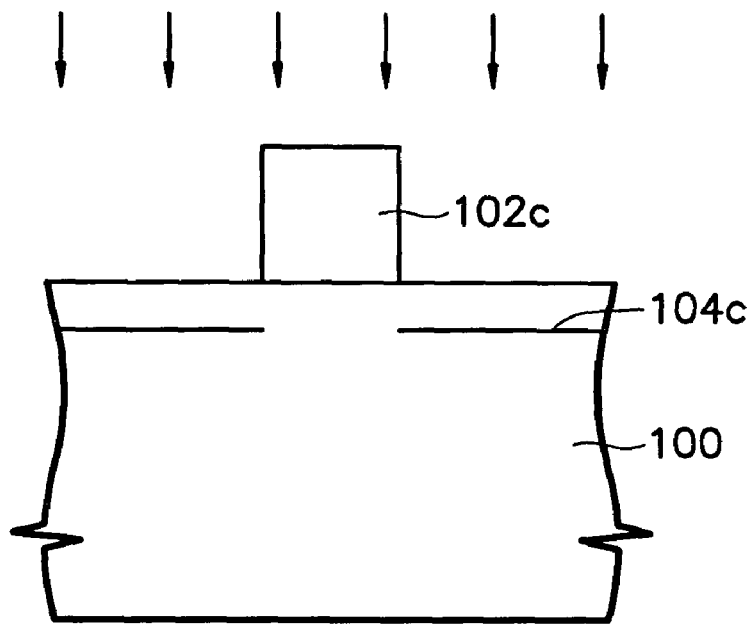

Referring to FIGS. 2A to 2C, a device isolation layer (not shown) is formed in a semiconductor substrate 100 to define a cell array region and a peripheral region, and a gate oxide layer (not shown) is formed over the semiconductor substrate 100. Gate electrodes are then simultaneously formed in the cell array region (FIG. 2A) and in the peripheral region (FIG. 2B and FIG. 2C), i.e., a first gate electrode 102a, a second gate electrode 102b, and a third gate electrode 102c are formed. The gate electrodes 102a, 102b, and 102c are preferably formed by depositing and patterning a polysilicon layer over the substrate 100.

Since the cell array region is more susceptible to the design rule than the peripheral region, gate widths in the cell array region must be narrower than those in the peripheral region. This can be seen on FIGS. 2A-2C by comparing the width of the gate electrode in FIG. 2A with those in FIGS. 2B and 2C.

After the formation of the gate electrodes 102a-102c, a first photoresist layer (not shown) is formed, preferably by spin coating, over the semiconductor substrate 100 and the first gate electrode 102a, and is patterned into a desired configuration, i.e., first photoresist pattern 103, exposing the peripheral region while covering the cell array region. Low concentration n-type impurity ions are then implanted into the semiconductor substrate 100 of the peripheral region using the gate electrodes 102b and 102c as a mask, thereby forming first, n-type impurity diffusion layers 104b and 104c, respectively. The implantation of n-type impurity ions is preferably carried out with arsenic (As) at an energy of about 50 keV, with a dose of about $5\times10^{12}$ ions/cm$^2$.

Figure 3A:
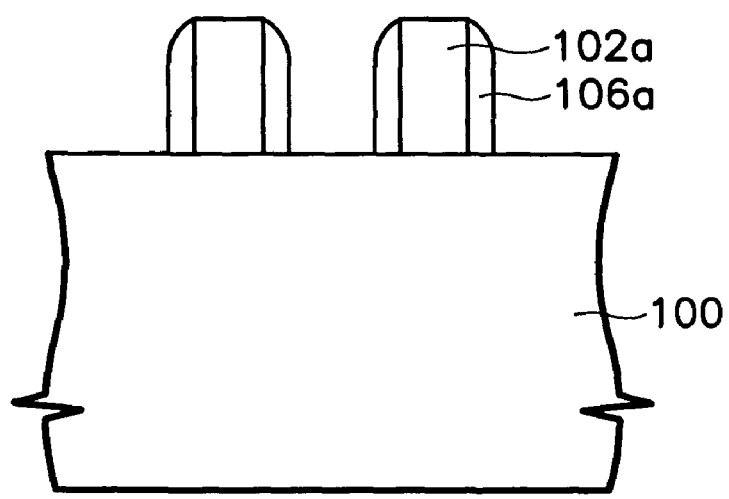
FIGS. 3A to 3C respectively illustrate a process step subsequent to that shown in FIGS. 2A to 2C, wherein first gate spacers are formed on sidewalls of the gate electrode.
Figure 3B:
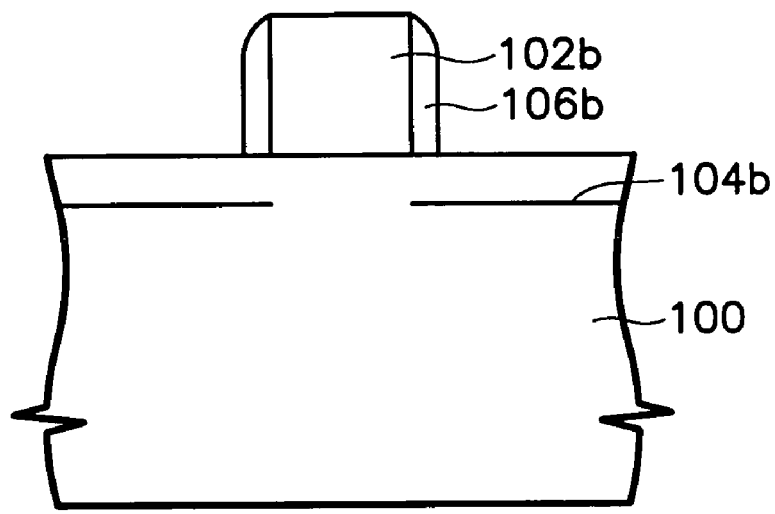
Figure 3C:
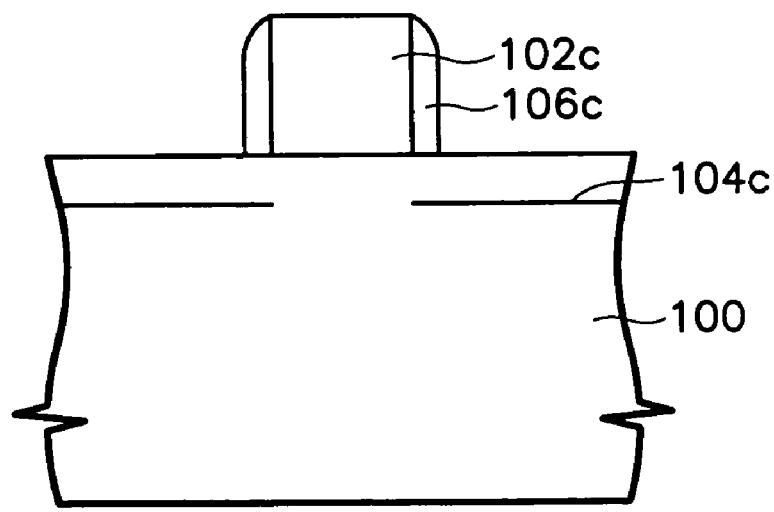

The formation of first spacers is next addressed and shown schematically in FIGS. 3A to 3C. After removing the first photoresist pattern 103, a first insulating layer, e.g., a silicon nitride layer, (not shown) is deposited over the entire resulting semiconductor topology. The deposited insulating layer is then anisotropically etched to form first gate spacers 106a, 106b, and 106c on the sidewalls of the first, second, and third gate electrodes 102a-102b, respectively, preferably with a thickness of about 400 Å.

Figure 4A:
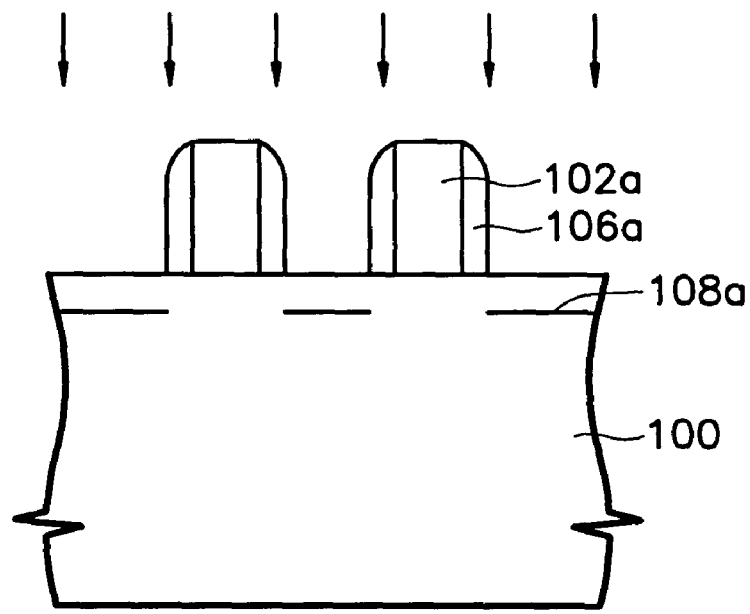
FIGS. 4A to 4C respectively illustrate a process step subsequent to that shown in FIGS. 3A to 3C, wherein an implantation of a low concentration of n-type impurities is carried out only in the cell array region, using the first spacers and gate electrode as a mask.
Figure 4B:
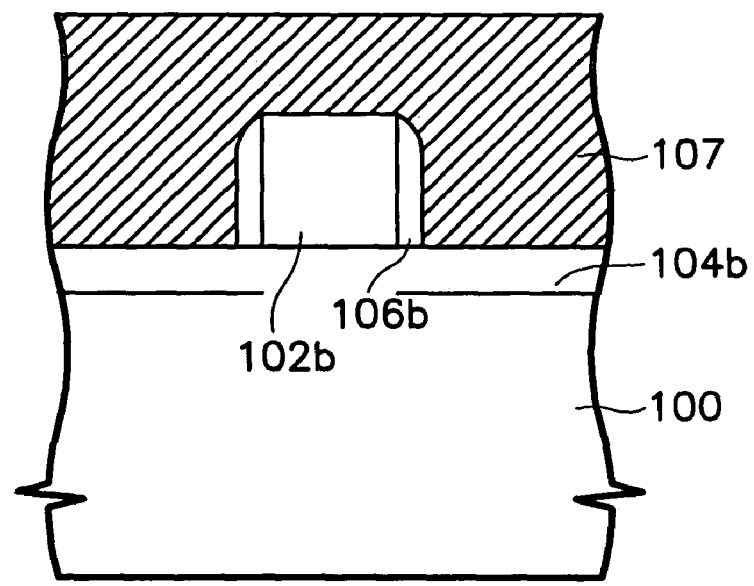
Figure 4C:
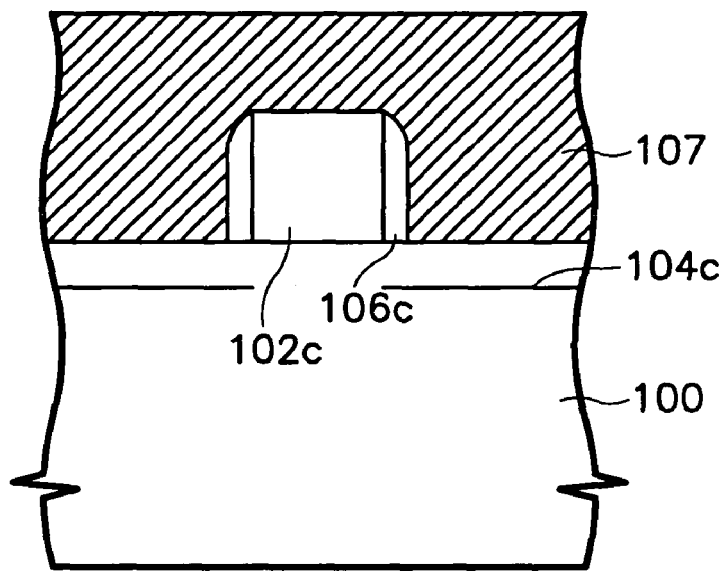

The next process sequence is the formation of a low concentration n-type impurity diffusion layer in the cell array region. Referring to FIGS. 4A to 4C, a second photoresist layer (not shown) is deposited, preferably by spin coating, over the entire resulting semiconductor topology and is patterned into the desired configuration, i.e., a second photoresist pattern 107 exposing the cell array region while covering the peripheral region. Low concentration n-type impurity ions are then implanted into the semiconductor substrate 100 in the cell array region using the gate electrode 102a and the first spacers 106a as a mask. This results in the formation of a second, n-type impurity diffusion layer 108a in the cell array region. This implantation is preferably carried out using phosphorous (P) ions at an energy of about 30 keV, with a dose of about $5\times10^{12}$ ions/cm$^2$.

Figure 5A:
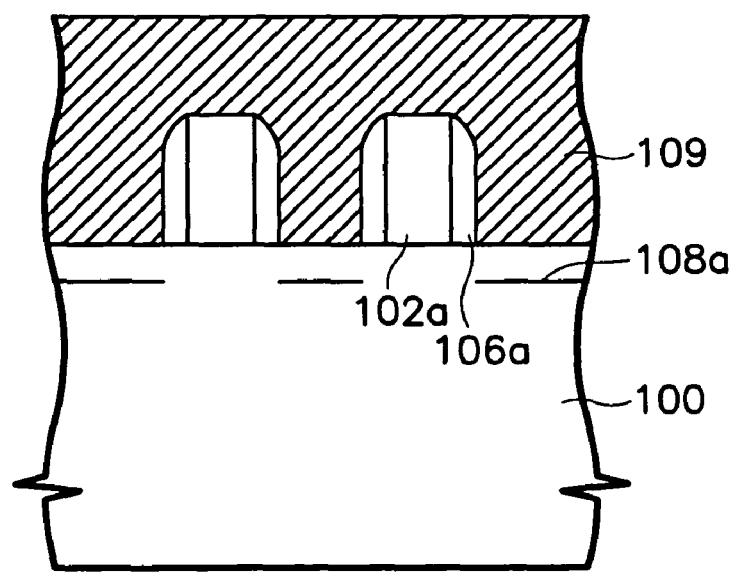
FIGS. 5A to 5C respectively illustrate a process step subsequent to that shown in FIGS. 4A to 4C, wherein an implantation of a low concentration of p-type impurities is carried out in the peripheral region.
Figure 5B:
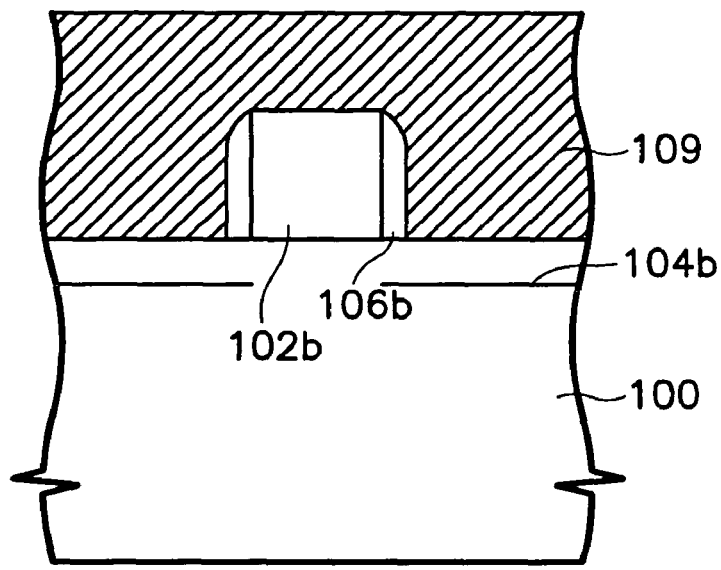
Figure 5C:
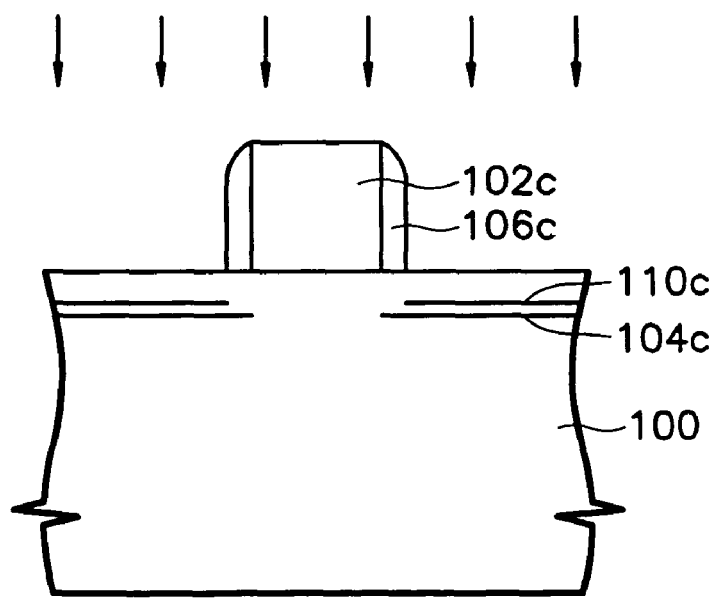

After removing the second photoresist pattern 107, a third photoresist layer (not shown) is then deposited and patterned into a desired configuration, i.e., a third photoresist pattern 109. The third photoresist pattern 109 exposes only the third gate electrode 102c in the peripheral region where a peripheral PMOS transistor is to be formed, as shown in FIGS. 5A to 5C. At this point, the first gate electrode 102a and the second gate electrode 102b are covered by the third photoresist pattern 109. Low concentration p-type impurity ions are then implanted into the semiconductor substrate 100 in the peripheral region using the third gate electrode 102c and the first spacers 106c as a mask, to thereby form a third, p-type impurity diffusion layer 110c of in the cell array region. The p-type impurity may include boron (B) and these impurity ions are preferably implanted at an energy of about 20 keV, with a dose of about $1\times10^{13}$ ions/cm$^2$.

Figure 6A:
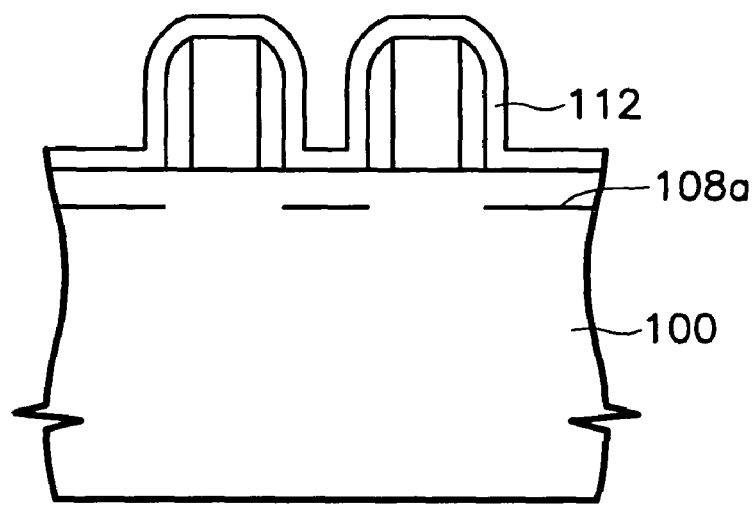
FIGS. 6A to 6C respectively illustrate a process step subsequent to that shown in FIGS. 5A to 5C, wherein an insulating layer for use as second spacers is formed.
Figure 6B:
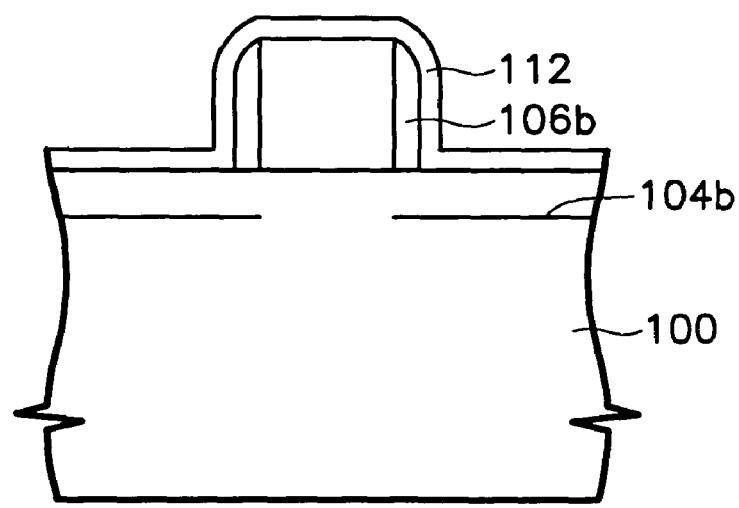
Figure 6C:
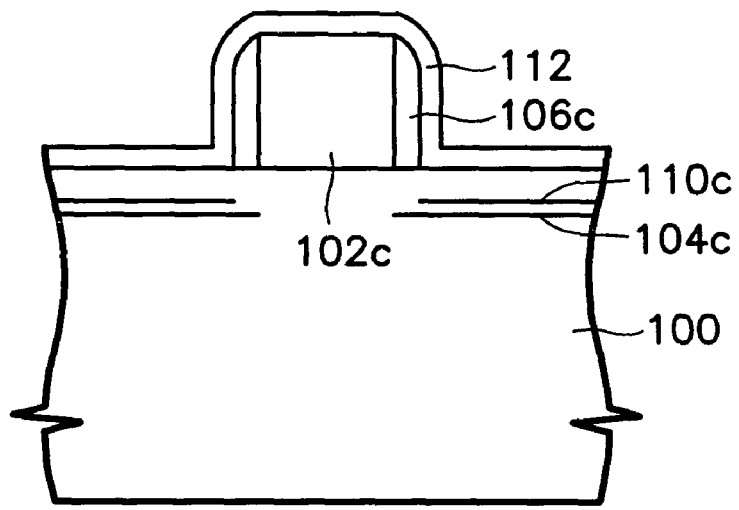

Referring to FIGS. 6A to 6C, after removing the third photoresist pattern 109, an insulating layer 112, e.g., a silicon nitride layer, is deposited over the resulting semiconductor topology. As will be described later, the insulating layer 112 serves as a barrier layer against silicidation in the cell array region and also serves to facilitate the formation of second gate spacers in the peripheral region.

Figure 7A:
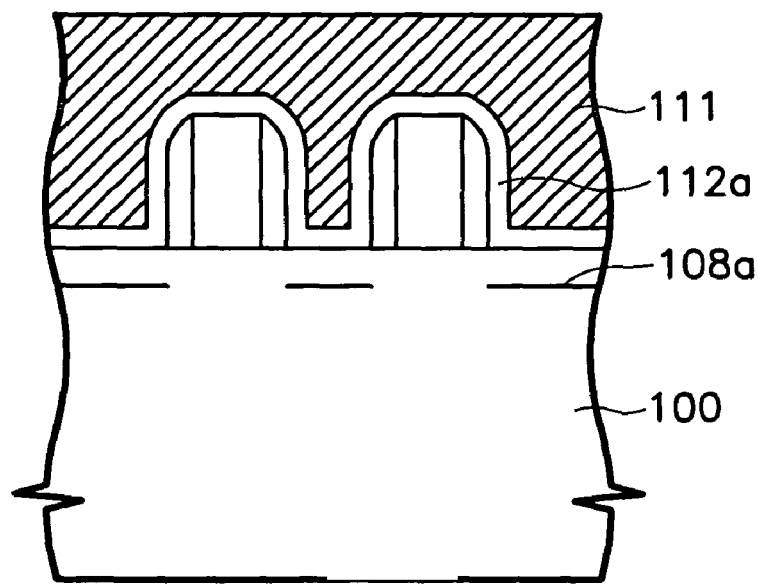
FIGS. 7A to 7C respectively illustrate a process step subsequent to that shown in FIGS. 6A to 6C, wherein an etch back is carried out only in the peripheral region to form second spacers on sidewalls of the first spacers in the peripheral region.
Figure 7B:
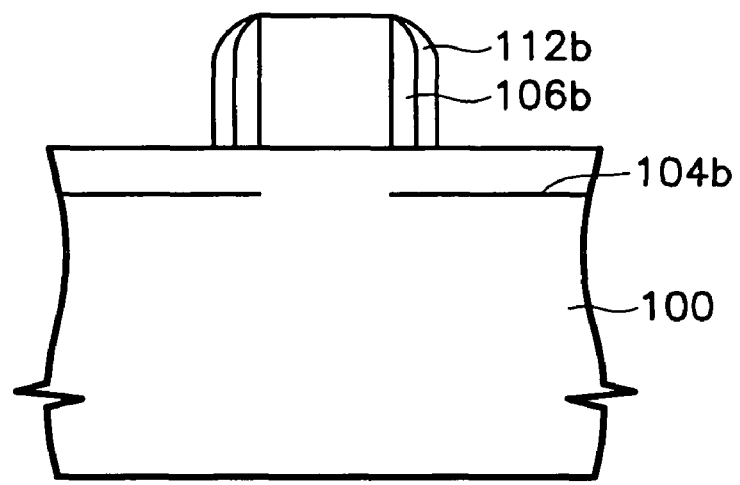
Figure 7C:
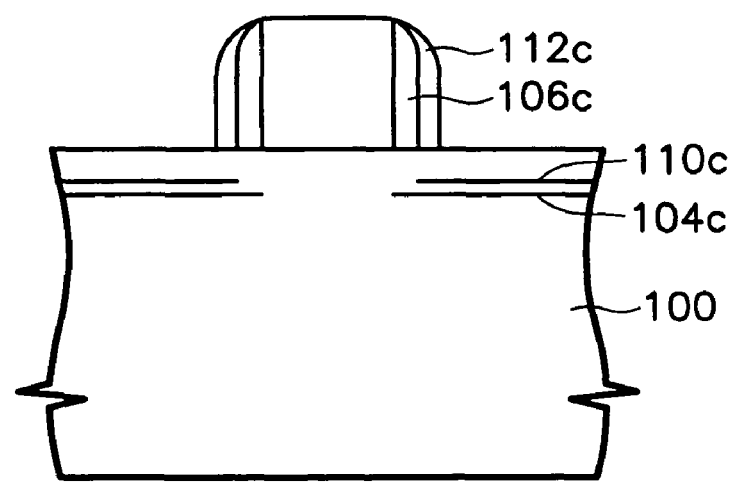

A fourth photoresist layer (not shown) is then deposited and patterned into a desired configuration, i.e., a fourth photoresist pattern 111. The fourth photoresist pattern 111 exposes the insulating layer 112 in the peripheral region while covering the insulating layer 112 in the cell array region. As shown in FIGS. 7A to 7C, the insulating layer 112 is then anisotropically etched, using the fourth photoresist pattern 111 as a mask, to respectively form second spacers 112b and 112c adjacent to the first spacers 106b and 106c by the second and third gate electrodes 102b and 102c, with a thickness of about 400 Å.

As a result of this etching, a double spacer configuration is formed next to the gates in the peripheral region. At this point, because the insulating layer 112 in the cell array region is covered by the fourth photoresist pattern 111, it is not etched, and a portion of the insulating layer 112 remains in the cell array region. This remaining insulating layer 112a will serve as a barrier layer against silicidation.

Figure 8A:
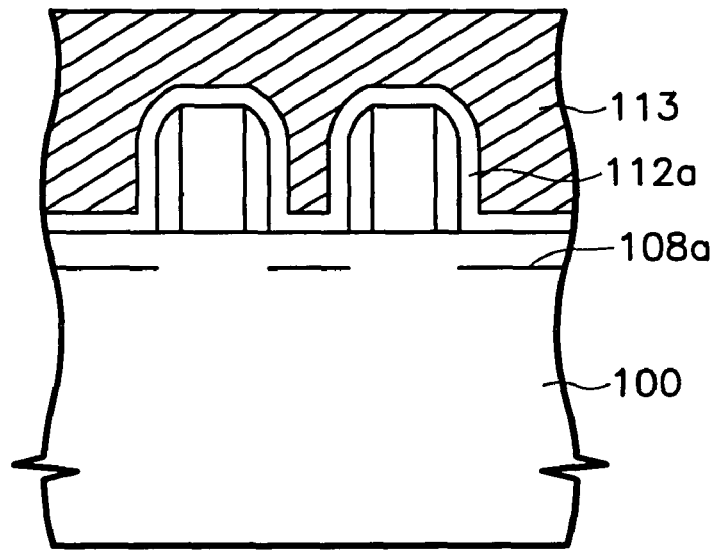
FIGS. 8A to 8C respectively illustrate a process step subsequent to that shown in FIGS. 7A to 7C, wherein an implantation of a high concentration of n-type impurities is carried out only in the peripheral region.
Figure 8B:
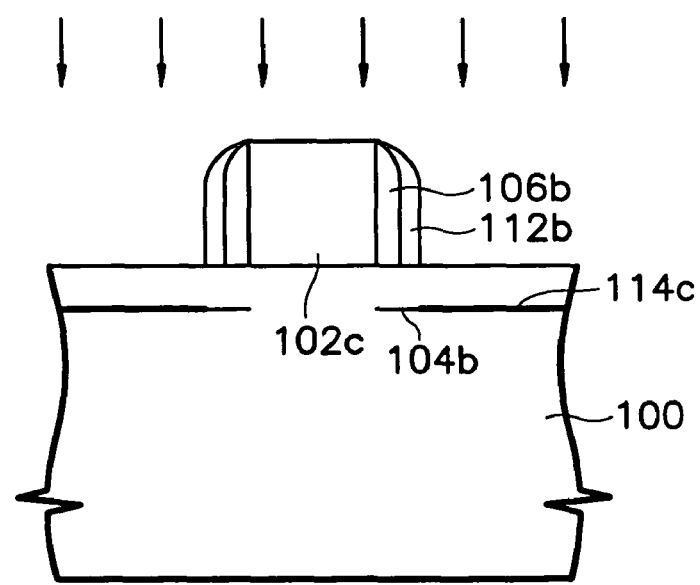
Figure 8C:
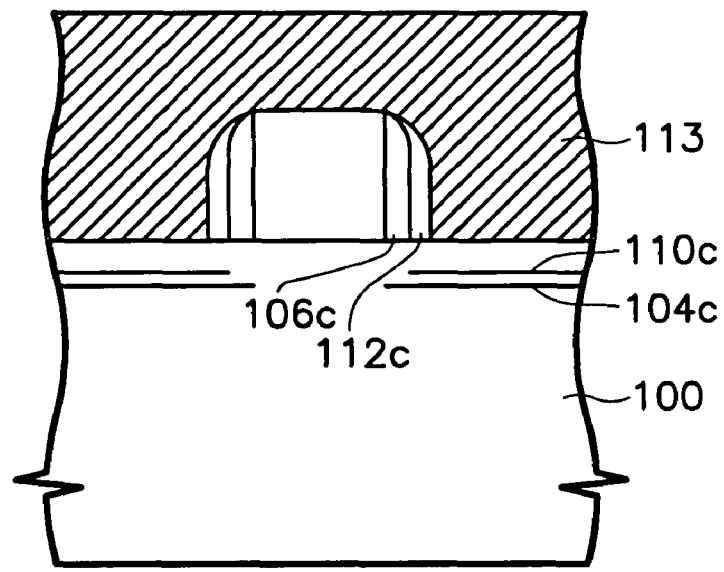

After removing the fourth photoresist pattern 111, a fifth photoresist layer (not shown) is then deposited and patterned into a desired configuration, i.e., a fifth photoresist pattern 113. As shown in FIGS. 8A to 8C, the fifth photoresist pattern 113 is formed to expose only the second gate electrode 102b and its spacers 106b and 112b in the peripheral region, while covering the first and third gate electrodes 102a and 102c and their spacers 106a, 106c, and 112c. Using the fifth photoresist pattern 115, the gate electrode 102b, and the second and third spacers 106b and 112b as a mask, high concentration n-type impurity ions are implanted into the semiconductor substrate 100 to form a fourth, n-type impurity diffusion layer 114c. The implantation of n-type impurity ions is preferably carried out using arsenic (As) at an energy of about 50 keV, with a dose of about $5\times10^{12}$ ions/cm$^2$.

Figure 9A:
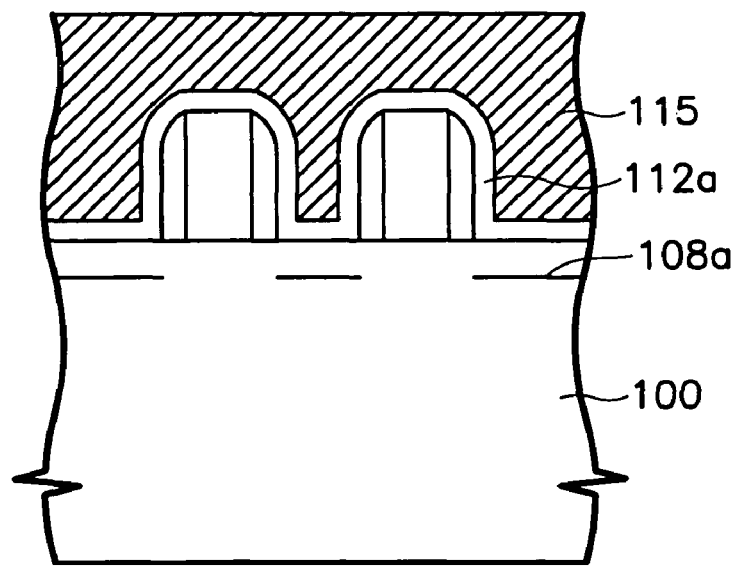
FIGS. 9A to 9C respectively illustrate a process step subsequent to that shown in FIGS. 8A to 8C wherein an implantation of a high concentration of p-type impurities is carried out only in the portion of the peripheral region containing peripheral PMOS transistors, for PMOS transistor formation in the peripheral region.
Figure 9B:
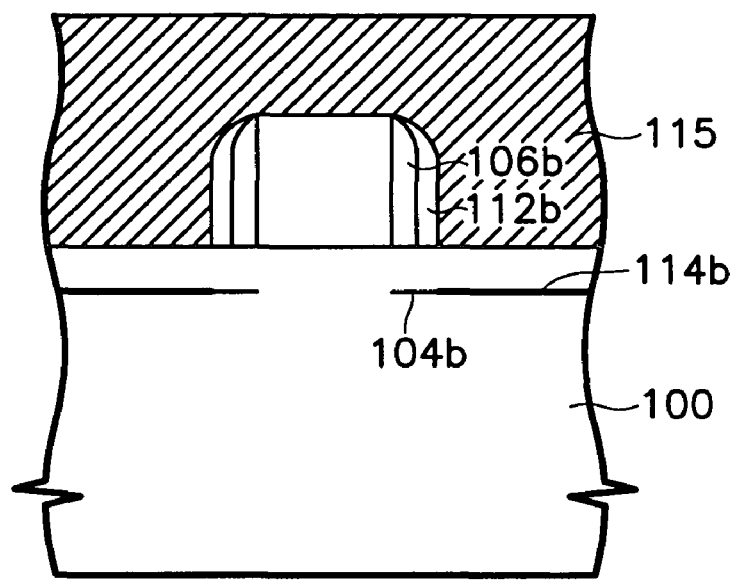
Figure 9C:
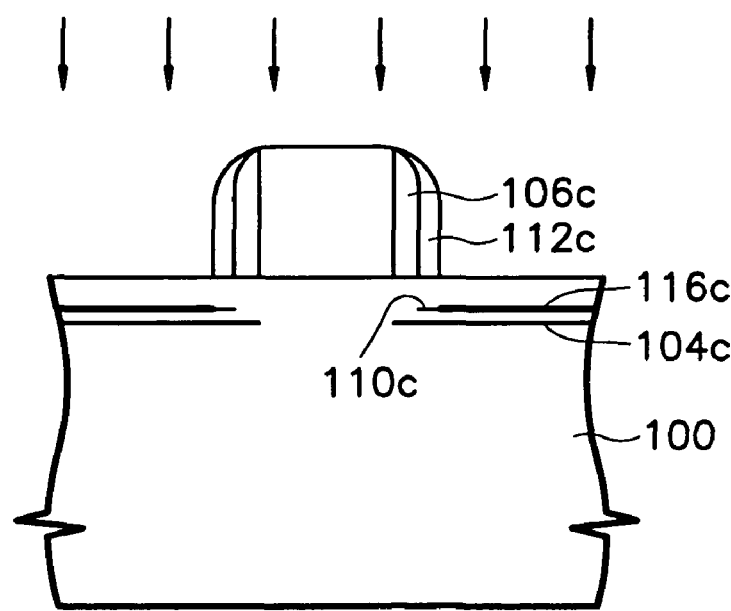

After removing the fifth photoresist pattern 113, a sixth photoresist layer (not shown) is then deposited and patterned into a desired configuration, i.e., a sixth photoresist pattern 115. As shown in FIGS. 9A to 9C, the sixth photoresist pattern 115 is formed to expose only the region where the peripheral PMOS transistor is to be formed, i.e., to expose the third gate electrode 102c and spacers 106c and 112c. Using the sixth photoresist pattern 115, the third gate electrode 102c, and the spacers 106c and 112c as a mask, high concentration p-type impurity ions are implanted into the semiconductor substrate 100 to form a fifth, p-type impurity diffusion layer 116c in the peripheral region. The p-type impurity preferably includes boron fluoride ($BF_2$) and these impurity ions are preferably implanted at an energy of about 20 keV, with a dose of about $5\times10^{15}$ ions/cm$^2$. Consequently, a peripheral PMOS transistor is formed in the peripheral region to the desired configuration with a first impurity diffusion layer 104c of a low concentration n-type impurity, a third impurity diffusion layer 110c of a low concentration p-type impurity, and a fifth impurity diffusion layer 116c of a high concentration p-type impurity.

Figure 10A:
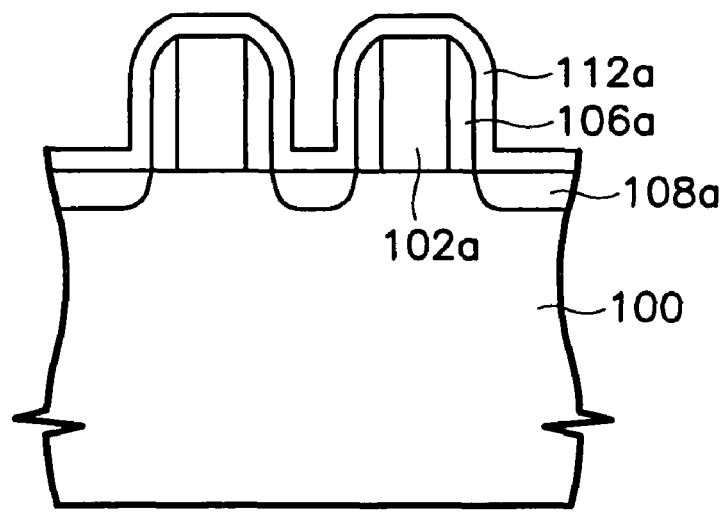
FIGS. 10A to 10C respectively illustrate a process step subsequent to that shown in FIGS. 9A to 9C wherein a silicidation process is carried out to form a silicide layer in the peripheral region.
Figure 10B:
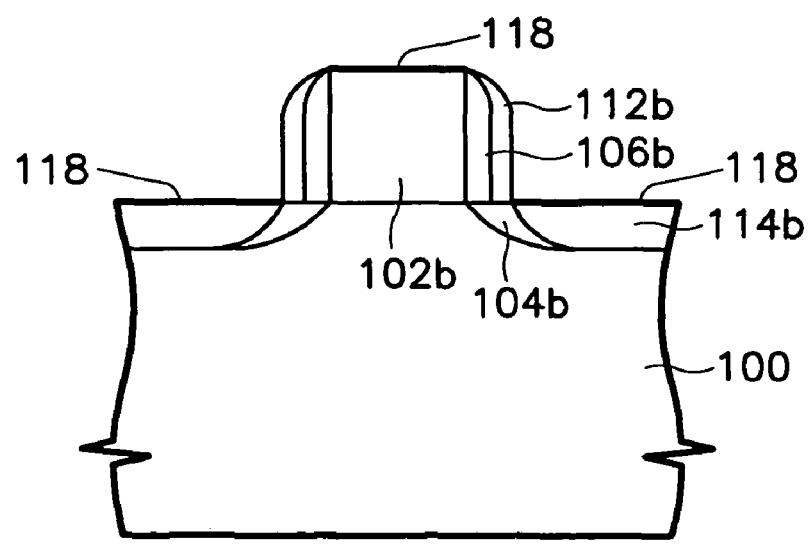
Figure 10C:
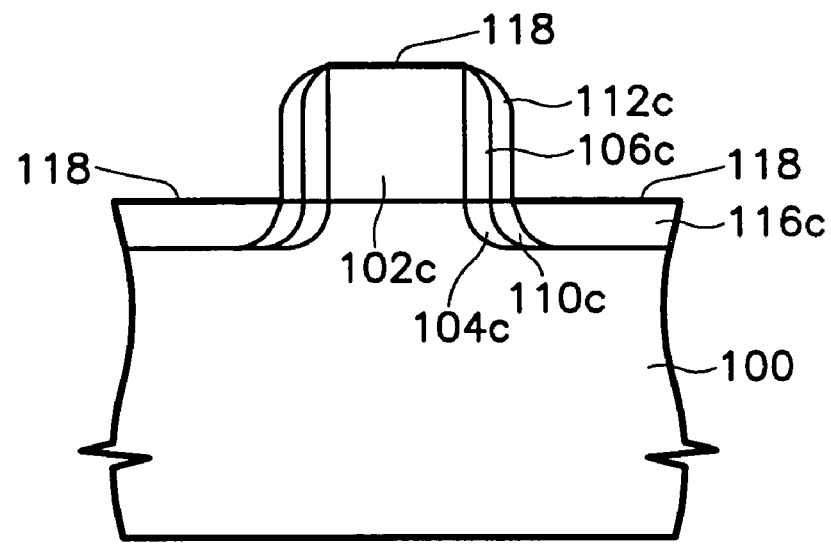

The next process sequence is the formation of the silicide layer, which is schematically shown in FIGS. 10A to 10C. A silicide layer formed over the source/drain region and over the gate electrodes in the peripheral region can decrease the consumption voltage of the resulting DRAM device and can increase its operation speed. At this point, a transition metal, such as Ti, Ta, Co, or Mo, is deposited over the resulting semiconductor topology as a transition metal layer (not shown). After depositing the transition metal, an annealing process is carried out to form a silicide layer 118.

As is well known, the silicide layer 118 is formed by the reaction between silicon and the transition metal. Therefore, as can be seen in FIGS. 10B and 10C, the silicide layer 118 is formed only on areas of exposed silicon and polysilicon, i.e., on the exposed semiconductor substrate 100 and on the exposed polysilicon gates 102b and 102c in the peripheral region. Because the remaining insulating layer 112a covers the semiconductor substrate and the first gate electrode in the cell array region no silicidation occurs in the cell array region. The presence of the remaining insulating layer 112a prevents the silicidation process in the cell array region by preventing the transition metal from contacting any silicon. Were this not prevented, the current leakage of the transistors in the cell array region would be undesirably increased.

During the annealing process for silicidation, impurity ions of the previously mentioned impurity diffusion layers are diffused to form respective impurity regions. More specifically, referring to FIGS. 10A to 10C, the transistor formed on the cell array region, i.e., the cell array NMOS transistor (see FIG. 10A), includes the first gate electrode 102a, first spacers 106a, and a source/drain region 108a (i.e., the second impurity region 108a) of a low concentration n-type impurity. The NMOS transistor formed on the peripheral region, i.e., the peripheral NMOS transistor (see FIG. 10B) includes the second gate electrode 102b, first and second spacers 106b and 112b, and source/drain regions 104b and 114b. As can be seen, the source/drains comprise the first impurity region 104b of a low concentration n-type impurity aligned below the first and second spacers 106b and 112b and the fourth impurity region 114b of a high concentration n-type impurity aligned outwardly from the lateral edges of the second spacers 112b. The PMOS transistor formed on the peripheral region, i.e., the peripheral PMOS transistor (see FIG. 10C) includes the third gate electrode 102c, first and second spacers 106c and 112c, and source/drain regions 104c, 110c, and 116c. As can be seen in FIG. 10C, the source/drain regions comprise the first impurity region 104c of low concentration n-type impurity, aligned below the first spacers 106c, the third impurity region 110c of low concentration p-type impurity, aligned below the second spacers 112c, and the fifth impurity region 116c of high concentration p-type impurity, aligned outwardly from the lateral edges of the second spacers 112c.

In the peripheral PMOS transistor, the heat burden applied to the semiconductor device during subsequent layer formation processes makes the first impurity region 104c of n-type overlap with the third impurity region 110c and thereby transforms the first impurity region 104c from n-type to p-type.

After the formation of the silicide layer, a remaining portion of the transition layer which has not reacted with the silicon or polysilicon is removed. As a result, the sheet resistance of the source/drain region can be reduced to increase the operation speed of the device.

Figure 11A:
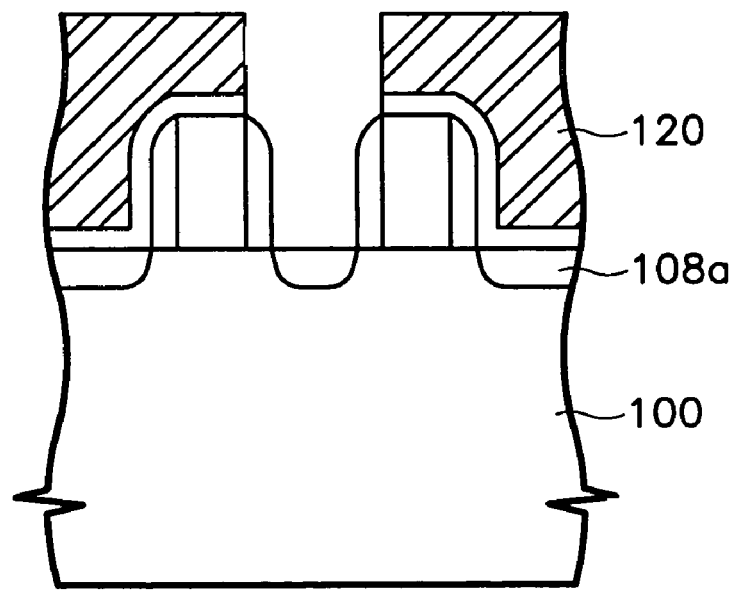
FIGS. 11A to 11C respectively illustrate a process step subsequent to that shown in FIGS. 10A to 10C wherein a contact hole is formed in the cell array region.
Figure 11B:
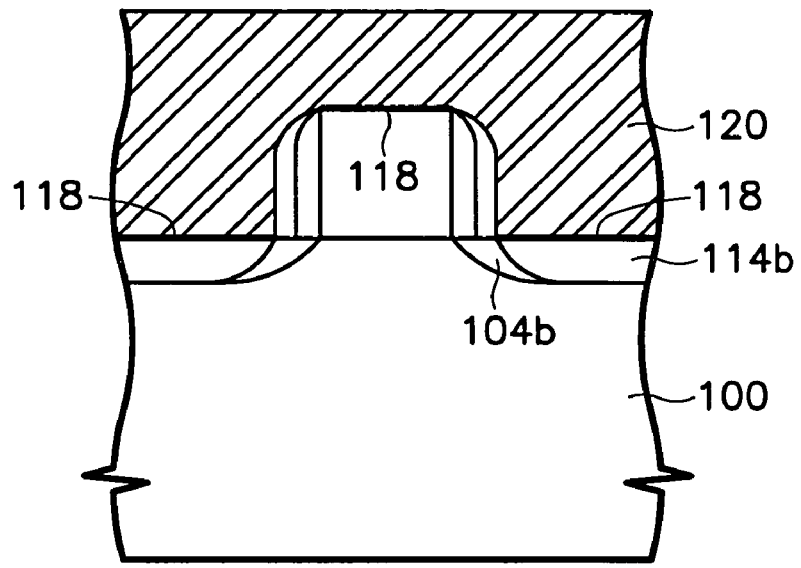
Figure 11C:
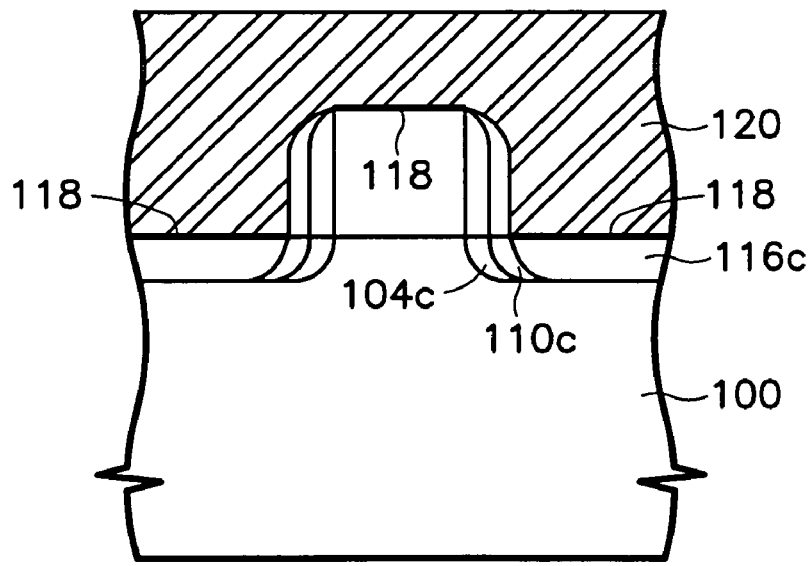

Referring to FIGS. 11A to 11C, an interlayer insulating layer 120 is then deposited over the entire semiconductor substrate. A seventh photoresist layer (not shown) is deposited over the interlayer insulating layer and is patterned into a desired configuration. Using the seventh photoresist pattern (not shown), desired portions of the interlayer insulating layer 120 are anisotropically etched to form a contact hole that exposes the source/drain region of the cell array NMOS transistor, as shown in FIG. 11A. The interlayer insulating layer 120 is selectively etched (preferably for about five times) with respect to the remaining insulating layer 112a and thereby forms the contact hole in a self aligned manner.

According to the present invention, the cell array NMOS transistor includes a gate electrode, a single spacer, and a source/drain region of low concentration n-type impurity region. The peripheral NMOS transistor includes a gate electrode, double spacers, and an LDD source/drain region including a low concentration n-type impurity region and a high concentration n-type impurity region. The peripheral PMOS transistor includes a gate electrode, double spacers, and a double LDD source/drain structure including a low concentration p-type impurity region, a low concentration n-type impurity region, and a high concentration p-type impurity region. The double LDD source/drain structure of the peripheral PMOS transistor can prevent the short channel effect and can reduce the hot carrier effect. Furthermore, the remainder of the insulating layer used to create the second spacers serves the additional purpose of being a silicidation barrier layer and etching stopping layer and thereby simplifies the manufacturing process.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples are not intended to exhaust the full scope of variation in the disclosed novel concepts.

What is claimed is:

1. A method for fabricating a semiconductor device comprising:

forming a device isolation region on a semiconductor substrate to define a cell array region and a peripheral circuit region;

forming a first gate in the cell array region, a second gate in the peripheral circuit region, and a third gate in the peripheral circuit region;

implanting first impurity ions of a low concentration into a first portion of the semiconductor substrate adjacent to the second and third gates, using the second and third gates as a mask, to form a first impurity diffusion region of a first conductivity type;

forming first gate spacers on lateral sides of the first, second, and third gates;

implanting second impurity ions of a low concentration into a second portion of the semiconductor substrate adjacent to the first gate and first gate spacers on the lateral sides of the first gate, using the first gate and first gate spacers as a mask, to form a second impurity diffusion region of a first conductivity type;

implanting third impurity ions of a low concentration into a third portion of the semiconductor substrate adjacent to the third gate and the first gate spacers on the lateral side of the third gate, using the third gate and first gate spacers as a mask, to form a third impurity diffusion region of a second conductivity type;

forming an insulating layer over the semiconductor substrate, first through third gates, and first gate spacers;

etching the insulating layer in the peripheral region to form second gate spacers adjacent to the first spacers on the lateral side of the second and third gates, respectively;

implanting fourth impurity ions of a high concentration into a fourth portion of the semiconductor substrate adjacent to the second gate and the second spacers on the lateral sides of the first spacers of the second gate, using the second gate and the first and second spacers as a mask, to form a fourth impurity diffusion region of a first conductivity type; and implanting fifth impurity ions of a high concentration into a fifth portion of the semiconductor substrate adjacent to the third gate and the second spacers on the lateral side of the third gate, using the third gate and first and second spacers as a mask, to form a fifth impurity diffusion region of a second conductivity type.

2. The method for fabricating a semiconductor device, as recited in claim 1, wherein the first conductivity type is n-type.

3. The method for fabricating a semiconductor device, as recited in claim 1, wherein the implanting of first impurity ions has a lower ion diffusivity than the step of implanting second impurity ions.

4. The method for fabricating a semiconductor device, as recited in claim 1, wherein the first through third gates comprise polysilicon.

5. The method for fabricating a semiconductor device, as recited in claim 1, wherein the implanting of first impurity ions is performed using arsenic with a dose range of about $5 \times 10^{12}$ ions/cm$^2$ and at an energy range of about 50 keV.

6. The method for fabricating a semiconductor device, as recited in claim 1, wherein the implanting of second impurity ions is performed using phosphorous with a dose range of about $5 \times 10^{12}$ ions/cm$^2$ and at an energy range of about 30 keV.

7. The method for fabricating a semiconductor device, as recited in claim 1, wherein the implanting of third impurity ions is performed using boron with a dose range of about $1 \times 10^{13}$ ions/cm$^2$ and at an energy range of about 20 keV.

8. The method for fabricating a semiconductor device, as recited in claim 1, wherein the implanting of fourth impurity ions is performed using arsenic with a dose range of about $5 \times 10^{15}$ ions/cm$^2$ and at an energy range of about 50 keV.

9. The method for fabricating a semiconductor device, as recited in claim 1, wherein the implanting of fifth impurity ions is performed using boron fluoride (BF$_2$) with a dose range of about $5 \times 10^{15}$ ions/cm$^2$ and at an energy range of about 20 keV.

10. The method for fabricating a semiconductor device, as recited in claim 1, further comprising:

forming a silicide layer over the semiconductor substrate, the second gate, and the third gate in the peripheral circuit region; and forming an interlayer insulating layer over the substrate and first through third gates;

etching a selected portion of the interlayer insulating layer in the cell array region, using the insulating layer as an etching stopper, and forming a contact opening adjacent to the first gate.

11. The method for fabricating a semiconductor device, as recited in claim 10, wherein the forming of a silicide layer is further comprises forming a transition metal over the substrate and the second and third gates annealing the substrate and the transition metal to form the silicide layer.

12. The method for fabricating a semiconductor device, as recited in claim 11, wherein during the annealing of the substrate and the transition metal, the first through fifth impurities are diffused into the first through fifth impurity diffusion regions, respectively.

13. The method for fabricating a semiconductor device, as recited in claim 10, wherein the a remaining portion of the insulating layer, after the etching of the insulating layer in the peripheral region, serves as a barrier layer to prevent silicidation in the cell array area during the forming of a silicide layer.

14. The method for fabricating a semiconductor device, as recited in claim 10, wherein the interlayer insulating layer has a first etching rate at least five times as high as a second etching rate of the insulating layer.

15. A method for fabricating a semiconductor device, the method comprising the steps of:

forming a first gate electrode over a PMOS region of semiconductor substrate and a second gate electrode over an NMOS region of the semiconductor substrate;

implanting first impurity ions at a low concentration of a first conductivity type, using the first and second gate electrodes as a mask, to form first impurity diffusion layers in the NMOS and PMOS regions;

forming first spacers on lateral sides of the first gate electrode and second spacers on lateral sides of the second gate electrode;

masking the NMOS region while implanting second impurity ions at a low concentration of a second conductivity type, using the first gate electrodes and first spacers as a mask, to form a second impurity diffusion layer in the PMOS region;

forming a third spacers adjacent to the first spacers, and fourth spacers adjacent the second spacers;

implanting third impurity ions of high concentration of the second conductivity type in the PMOS region, using the first gate electrode and the first and third spacers as a mask, to form a third impurity diffusion layer in the PMOS region;

implanting fourth impurity ions of high concentration of the first conductivity type in the NMOS region, using the second gate electrode and the second and fourth spacers as a mask, to form a fourth impurity diffusion layer in the NMOS region; and annealing and diffusing the impurity diffusion layers to define a single lightly-doped drain (LDD) structure in the NMOS region and a double LDD structure in the PMOS region.

16. The method for fabricating a semiconductor device, as recited in claim 15, wherein the first conductivity type is n-type and the second conductivity type is p-type.

17. The method for fabricating a semiconductor device, as recited in claim 15, wherein the implanting of first impurity ions is performed using arsenic with a dose range of about $5 \times 10^{12}$ ions/cm$^2$ and at an energy range of about 50 keV.

18. The method for fabricating a semiconductor device, as recited in claim 15, wherein the implanting of second impurity ions is performed using boron with a dose range of about $1 \times 10^{13}$ ions/cm$^2$ and at an energy range of about 20 keV.

19. The method for fabricating a semiconductor device, as recited in claim 15, wherein the implanting of third impurity ions is performed using boron fluoride ($BF_2$) with a dose range of about $5\times10^{15}$ ions/cm$^2$ and at an energy range of about 20 keV.

20. The method of fabricating a semiconductor device, as recited in claim 15, wherein the semiconductor device includes a memory cell region and a peripheral circuit region, and the PMOS and NMOS regions are located in a peripheral circuit region.

* * * * *